US00RE39957E

(19) United States
(12) Reissued Patent
Huang et al.

(10) Patent Number: US RE39,957 E
(45) Date of Reissued Patent: Dec. 25, 2007

(54) METHOD OF MAKING SEMICONDUCTOR PACKAGE WITH HEAT SPREADER

(75) Inventors: Chien-Ping Huang, Taichung (TW); Tzong-Da Ho, Taichung (TW); Cheng-Hsu Hsiao, Taichung (TW)

(73) Assignee: Siliconware Precision Industries Co., Ltd., Tantzu, Taichung (TW)

(21) Appl. No.: 10/934,632

(22) Filed: Sep. 3, 2004

Related U.S. Patent Documents

Reissue of:
(64) Patent No.: 6,444,498
Issued: Sep. 3, 2002
Appl. No.: 09/990,752
Filed: Nov. 15, 2001

(30) Foreign Application Priority Data

Aug. 8, 2001 (TW) ..... 90119294

(51) Int. Cl.

| | |
|---|---|
| ***H01C 21/66*** | (2006.01) |
| ***H01C 21/00*** | (2006.01) |
| ***H01L 21/44*** | (2006.01) |
| ***H01L 23/28*** | (2006.01) |
| ***H01L 25/29*** | (2006.01) |
| ***H01L 23/48*** | (2006.01) |
| ***H01L 23/34*** | (2006.01) |
| ***H01L 23/10*** | (2006.01) |

(52) U.S. Cl. ..... 438/106; 438/15; 438/25; 438/26; 438/51; 438/55; 438/64; 438/106; 438/112; 438/122; 438/124; 438/126; 438/127; 257/796; 257/790; 257/783; 257/792; 257/709; 257/706; 257/717

(58) Field of Classification Search ..... None
See application file for complete search history.

(56) References Cited

U.S. PATENT DOCUMENTS

| | | | | | |
|---|---|---|---|---|---|
| 5,450,283 | A | * | 9/1995 | Lin et al. | 174/16.3 |
| 5,471,366 | A | * | 11/1995 | Ozawa | 361/704 |
| 5,608,267 | A | * | 3/1997 | Mahulikar et al. | 257/706 |
| 5,726,079 | A | * | 3/1998 | Johnson | 438/106 |
| 5,834,850 | A | * | 11/1998 | Hotta et al. | 257/788 |
| 5,904,505 | A | * | 5/1999 | Hotta et al. | 264/272.17 |
| 5,929,514 | A | * | 7/1999 | Yalamanchili | 257/666 |
| 6,117,797 | A | * | 9/2000 | Hembree | 438/759 |
| 6,144,108 | A | * | 11/2000 | Ohizumi et al. | 257/666 |
| 6,458,626 | B1 | * | 10/2002 | Huang et al. | 438/112 |
| 6,596,565 | B1 | * | 7/2003 | Hembree | 438/122 |
| 6,787,929 | B2 | * | 9/2004 | Yoshihara et al. | 257/792 |
| 2003/0011064 | A1 | * | 1/2003 | Combs et al. | 257/706 |

FOREIGN PATENT DOCUMENTS

| | | | |
|---|---|---|---|
| JP | 356133857 | * | 10/1981 |
| JP | 61-49446 | * | 3/1986 |
| JP | 61-194861 | * | 8/1986 |
| TW | 90118118 | * | 7/2001 |

OTHER PUBLICATIONS

Shaukatullah, "Thermal Enhancement of Surface Mount Electronic Packages with Heat Sinks", 1993 IEEE, p. 256–263.**

* cited by examiner

*Primary Examiner*—Carl Whitehead, Jr.
*Assistant Examiner*—James Mitchell

(57) ABSTRACT

A method is provided of making a semiconductor package with a heat spreader in which a chip carrier module plate consisting of a plurality of array-arranged chip carriers is mounted with at least one chip on each of the chip carriers. A heat spreader module plate is attached to the chips, with an interface layer formed on a top surface of the heat spreader module plate. The chip carrier module plate, the chips and the heat spreader module plate are encapsulated. Adhesion force between the interface layer and the encapsulant is larger than that between the interface layer and the heat spreader module plate, and adhesion force between the interface layer and the heat spreader module plate is smaller than that between the heat spreader module plate and the encapsulant.

29 Claims, 7 Drawing Sheets

METHOD OF MAKING SEMICONDUCTOR PACKAGE WITH HEAT SPREADER

Matter enclosed in heavy brackets [ ] appears in the original patent but forms no part of this reissue specification; matter printed in italics indicates the additions made by reissue.

FIELD OF THE INVENTION

The present invention relates to methods of making semiconductor packages, and more particularly, to a method of making a semiconductor package with a heat spreader, which can enhance heat-dissipating efficiency.

BACKGROUND OF THE INVENTION

How to efficiently dissipate heat generated by a semiconductor chip in operation and to assure lifetime and quality of a semiconductor package having the semiconductor chip encapsulated therein, has always been one critical topic to investigate in semiconductor industry.

Accordingly U.S. Pat. No. 5,726,079 discloses a semiconductor package shown in FIG. 8. This conventional semiconductor package 1 has a heat spreader 11 directly mounted on a semiconductor chip 10, with a top surface 110 of the heat spreader 11 being exposed to outside of an encapsulant 12 that encapsulates the chip 10. Due to the direct attachment of the heat spreader 11 to the chip 10, and the exposed top surface 110 of the heat spreader 11 in direct in contact with the atmosphere, thus heat generated by the chip 10 can be directly transmitted to the heat spreader 11 for being dissipated to the atmosphere. Such a heat dissipating path needs not to go through the encapsulant 12, thereby making the semiconductor package 1 good in heat dissipation.

However, there are several drawbacks for fabricating such a semiconductor package 1. First, when the chip 10 attached with the heat spreader 11 is placed in a molding cavity in a molding process, the top surface 110 of the heat spreader 11 is supposed to abutting a top wall of the molding cavity, so as to avoid the occurrence of flash on the top surface 110 of the heat spreader 11. If the top surface 110 of the heat spreader 11 cannot closely abut the top wall of the molding cavity with a gap being formed therebetween, thus a molding compound used for forming the encapsulant 12 flashes through the gap on the top surface 110 of the heat spreader 11. The flashes occurred on the heat spreader 11 not only deteriorate heat dissipating efficiency, but also impair appearance of the fabricated product. As a result, a deflash process is often required subsequently. However, this deflash process is time consuming and cost ineffective, and also possibly damages the fabricated product. On the other hand, if the heat spreader 11 too closely abuts the top wall of the molding cavity, damage to the chip 10 possibly occurs due to excessive abutting force.

Moreover, an adhesive or laminating tape used for adhering the heat spreader 11 to the chip 10 is mostly made of a thermosetting material, and thus appears to be soft prior to being subjected to a curing process. This makes structure of the chip 10 combined with the heat spreader 11 difficult to be controlled in height, thereby resulting in the foregoing problems due to the top surface 110 of the heat spreader 11 not properly coming into contact with the top wall of the molding cavity. As a result, quality of the fabricated product cannot be assured, as well as costs in fabrication cannot be reduced.

Furthermore, since precise height control is required for the combined structure of the heat spreader 11 and the chip 10, thus the heat spreader 11 cannot be attached to the chip 10 in batch-type manner for fabricating the semiconductor package 1. In other words, the heat spreader 11 has to be one-by-one deposited on the corresponding chip 10, and this therefore increases complexity and time consumption in fabrication, which is not favorable in cost reduction and fabrication efficiency improvement.

Besides, the heat dissipating efficiency of the semiconductor package 1 is proportional to surface area of the exposed top surface 110 of the heat spreader 11; that is; in the case of the semiconductor package 1 remaining intact in size, the heat spreader 11 identical in surface area to the package provides the maximum exposed area, as well as the maximum heat dissipating efficiency. However, when the heat spreader is dimensioned to have the same surface area as the package, edge sides of the heat spreader size needs to be aligned with side walls of the molding cavity. If the heat spreader is oversized due to fabrication inaccuracy, it cannot be successfully placed into the molding cavity; whereas if the heat spreader is undersized, flashes easily occur on the top surface or edge sides thereof. Therefore, such structure is disadvantageous in quality degradation and difficulty in fabrication.

U.S. Pat. No. 5,471,366 discloses another semiconductor package having an exposed heat spreader. In this semiconductor package, the heat spreader is encapsulated by an encapsulant in a molding process; whereas after completing the molding process, part of the encapsulant positioned above the heat spreader is ground until a top surface of the heat spreader being exposed to outside of the encapsulant. Such a disclosure eliminates the foregoing problems in the U.S. Pat. No. 5,726,079, but still have several drawbacks as follows. First, the use of the extra grinding process increases complexity and costs in fabrication for preparing a grinding machine and equipment. Moreover, if warpage occurs in the semi-fabricated package after forming the encapsulant, this degrades planarity of the semi-fabricated package to be ground, thereby making the semi-fabricated package easily damaged in the grinding process, and thus increasing the fabrication cost.

Chinese Patent Application No. 90118118 proposed by the inventor of the present invention discloses a fabrication method of a semiconductor package, so as to effectively improve the foregoing drawbacks in the conventional semiconductor packages having the exposed heat spreaders. This fabrication method comprises the following steps.

First, a heat spreader module plate is attached to a plurality of semiconductor chips mounted on a chip carrier module plate. Then, an interface layer is formed on the heat spreader module plate, allowing adhesion force between the interface layer and an encapsulating compound to be smaller than that between the heat spreader module plate and the encapsulating compound. Subsequently, an encapsulant is formed by the encapsulating compound to entirely encapsulate the chips and the heat spreader module plate. Then, a singulation process is performed to form individual semi-fabricated packages. Finally, residues of the encapsulating compound on the interface layer of the semi-fabricated packages are removed.

However, in the foregoing fabrication method, the interface layer formed on the heat spreader module plate usually has the adhesion force with the encapsulating compound much smaller than that between the heat spreader module plate and the encapsulating compound. When a jig is used to adsorb in vacuum the residues of the encapsulating compound on the interface layer of the semi-fabricated packages in the singulation process, the residues of the encapsulating compound often detach from the semi-fabricated packages under singulation, thereby making the singulated packages dislocated from the jig, and damaging the packages or equipment. Therefore, how to effectively maintain sufficient bonding between the residues of the encapsulating compound and the semiconductor packages during singulation has become a critical problem to solve.

SUMMARY OF THE INVENTION

A primary objective of the present invention is to provide a method of making a semiconductor package with a heat spreader, in which semi-fabricated packages can be held in position on a jig in a singulated process, and the heat spreader is dimensioned to have the maximal exposed area with no concern of flashes occurring thereon, so that heat dissipating efficiency can be improved.

Another objective of the invention is to provide a method of making a semiconductor package with a heat spreader, in which the heat spreader is directly attached to a semiconductor chip so as to increase the heat dissipating efficiency, and the chip can be prevented from being damaged in a molding process, so that quality of fabricated products can be assured.

Still another objective of the present invention is to provide a method of making a semiconductor package with a heat spreader, in which the heat spreader is attached to the chip in a batch-type manner, so as to simplify fabrication processes, and reduce time consumption, as well as decrease costs in fabrication.

A further objective of the present invention is to provide a method of making a semiconductor package with a heat spreader, in which there is no concern for controlling height of combined structure of the heat spreader and the chip, thereby making the fabrication cost reduced, and the fabrication quality improved.

A further objective of the present invention is to provide a method of making a semiconductor package with a heat spreader, in which a mold used in the molding process can be applied to difference sized products, and thus it is advantageous in reducing costs for equipment preparation and management.

In accordance with the foregoing and other objectives, the present invention proposes a method of making a semiconductor package with the heat spreader, comprising the steps of: preparing a matrix-type chip carrier module plate consisting of a plurality of array-arranged chip carriers, wherein each of the chip carriers has an upper surface and a lower surface; mounting at least one chip at a predetermined position on the upper surface of each of the chip carriers, and electrically connecting the chip to the chip carrier; providing a heat spreader module plate having an upper surface, and a lower surface attached to the chips mounted on the chip carriers so as to interpose the chips between the chip carrier module plate and the heat spreader module plate, and forming an interface layer on the upper surface of the heat spreader module plate, wherein adhesion force between the interface layer and a molding compound used for forming an encapsulant is larger than that between the interface layer and the heat spreader module plate, as well as adhesion force between the interface layer and the heat spreader module plate is smaller than that between the heat spreader module plate and the molding compound; forming the encapsulant by using the molding compound for encapsulating the heat spreader module plate and the chips; performing a singulation process to form individual semi-fabricated semiconductor packages; and removing residues of the molding compound formed on the interface layer and the interface layer.

Combined structure of the heat spreader module plate, the chips and the chip carrier module plate is smaller in height than a molding cavity of a mold used for forming the encapsulant. In other words, during a molding process, the molding compound forming the encapsulant covers the interface layer on the heat spreader module plate. Since the adhesion force between the interface layer and the molding compound is larger than that between the heat spreader module plate and the interface layer, thus the interface layer and the molding compound formed on the interface layer can be easily removed after forming the encapsulant. Further, since the adhesion force between a heat spreader (formed by singulating the heat spreader module plate) and the encapsulant is larger than that between the heat spreader and the interface layer, the removing process does not lead to delamination occurring between the heat spreader and the encapsulant or the chip. Moreover, since adhesion force between the interface and the molding compound formed on the interface layer is sufficient to firmly maintain the molding compound staying on the interface layer in the singulation process. Furthermore, as the heat spreader module plate does not abut to a top wall of the molding cavity of the mold, the chips can be prevented from cracking in the molding process. This also provides flexibility in height for a structure to be encapsulated by using the mold; that is, the same mold can be utilized to perform the molding process for semiconductor packages various in height.

The interface layer on the heat spreader module plate is made of a material such as polyimide tape or thermosetting epoxy resin, which generally has better adhesion force with the encapsulant than with the heat spreader module plate.

In one preferred embodiment of the invention, the chip carrier is a BGA (Ball Grid Array) substrate having at least one opening thereon for allowing bonding wires to pass therethrough so as to electrically connect the substrate to the chip. The substrate is mounted on its surface below the chip with a plurality of solder balls, which are used to provide electrical connection of the chip to external devices.

In another preferred embodiment of the invention, the chip carrier is a flip chip substrate, wherein a plurality of solder pads are array-arranged on a upper surface of the substrate for bonding a plurality of solder bumps thereto so as to electrically connect the chip to the substrate, whereas on a lower surface of the substrate there are implanted a plurality of solder balls for providing electrical connection of the chip to external devices.

In still another preferred embodiment of the invention, the chip carrier is a QFN (quad flat nonlead) lead frame or a BGA substrate, having an upper surface for mounting the chip thereon, and the chip is electrically connected to the lead frame or the substrate via a plurality of bonding wires. In order to avoid damage to the bonding wires caused by attaching a heat spreader to the chip, a connecting portion is formed on a first surface of the heat spreader at a position corresponding to the chip, and extends towards the chip, so as to allow the heat spreader to be connected to the chip by the connecting portion, without coming into contact with the bonding wires.

In a further preferred embodiment of the invention, the chip carrier is a QFN lead frame or a BGA substrate, having an upper surface for mounting the chip thereon, and the chip is electrically connected to the lead frame or the substrate by a plurality of bonding wires. In order to avoid contact with the bonding wires as a heat spreader is directly attached to the chip, and to reduce thermal stress caused by the difference in CTE (coefficient of thermal expansion) between the heat spreader and the chip, a buffer pad having a similar CTE to the chip is used to attach the chip to the heat spreader in a manner that, the buffer pad is interposed between the chip and the heat spreader. Further, in order to optimize the buffer pad to release the thermal stress generated from the heat spreader against the chip, the buffer pad is preferred to be a defective die.

Besides, in order to enhance bonding between the heat spreader and the encapsulant, a first surface of the heat spreader is roughened, corrugated, and made uneven.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

A first preferred embodiment of a method of making a semiconductor package of the invention is depicted with reference to FIGS. 1(A)-1(H); FIG. 2 illustrates a semiconductor package 2 fabricated in the use of a method of the first embodiment of the invention.

Figure 1A:
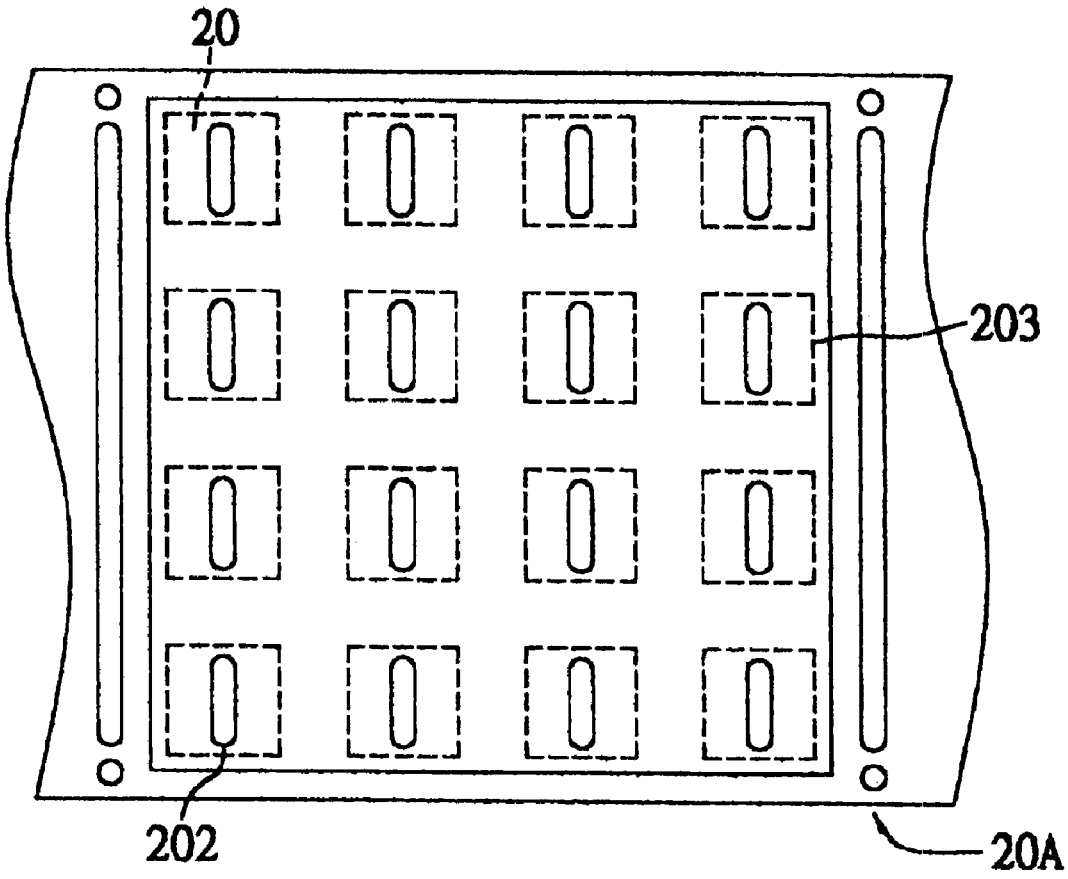
FIGS. 1(A)-1(H) are schematic diagrams depicting a first preferred embodiment of a method of a semiconductor package of the invention.
Figure 2:
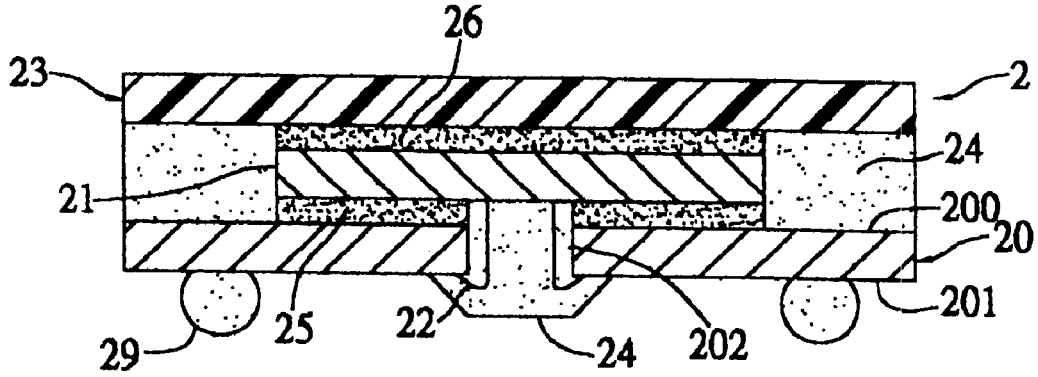
FIG. 2 is a sectional view of a semiconductor package fabricated in the use of a method of a first preferred embodiment of the invention.

Referring first to FIG. 1(A), the first step is to prepare a matrix-type substrate module plate 20A, which consists of sixteen substrates 20 arranged in 4×4 array. The substrates 20 each has an upper surface 200 and a lower surface 201, and is formed with an opening hole 202 penetrating the substrate 20.

Figure 1B:
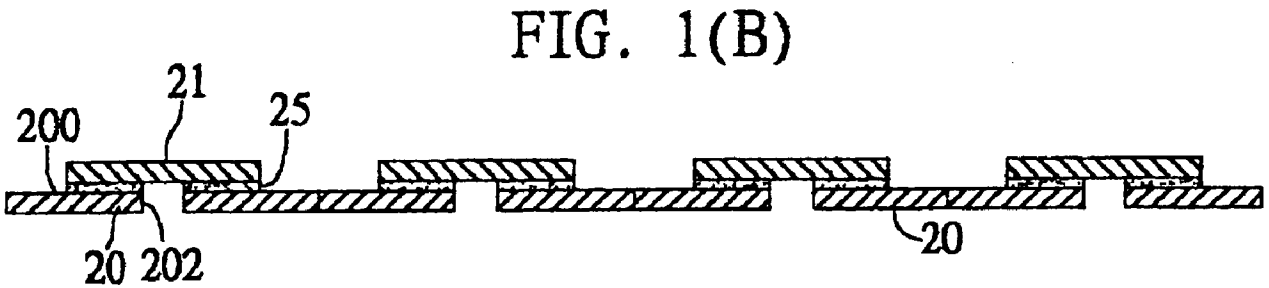

Referring next to FIG. 1(B), a semiconductor chip 21 is deposited at a pre-determined position on the upper surface 200 of each of the substrates 20 through the use of an adhesive 25 such as silver paste, allowing the chip 21 to cover one end of the opening hole 202.

Figure 1C:
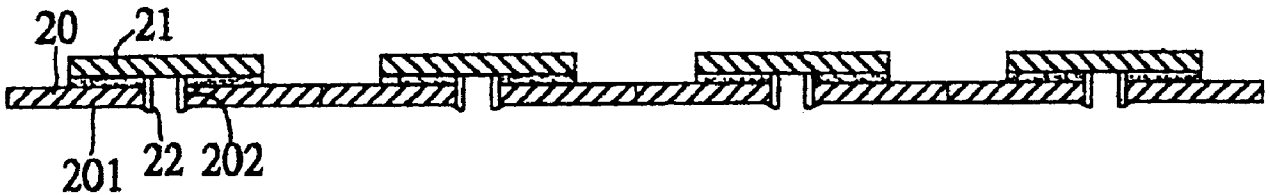

Referring further to FIG. 1(C), a plurality of gold wires 22 pass through the opening hole 202 to be bonded to the chip 21 and the lower surface 201 of the substrate 20 respectively, so as to electrically connect the chip 21 to the substrate 20. Since such a wire bonding process employs conventional technology, it is not further described herein.

Figure 1D:
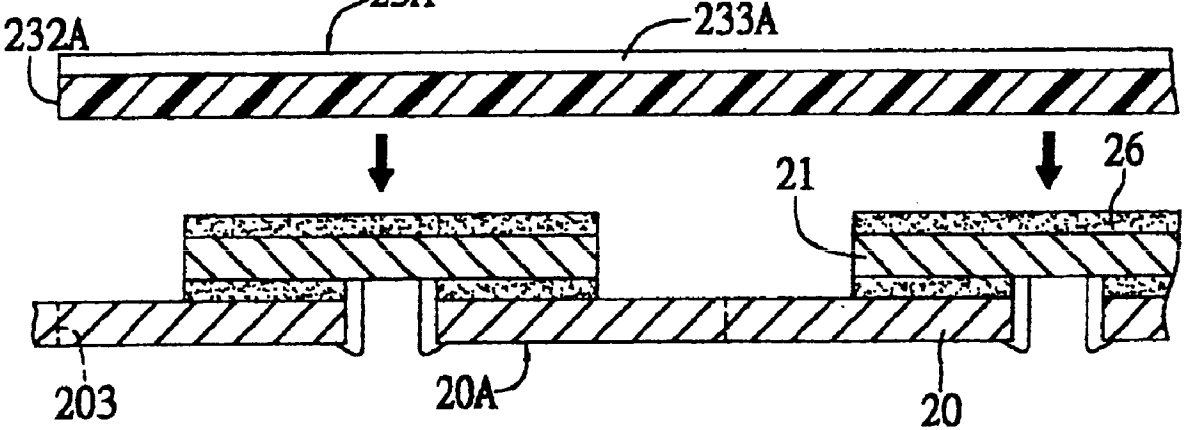

Referring to FIG. 1(D), after the chip 21 is electrically connected to the substrate 20, a heat spreader module plate 23A made of a metallic material such as copper, aluminum, copper alloy or aluminum alloy is attached to each of the chips 21 by means of a conventional adhesive 26 (or a tape). The heat spreader module plate 23A needs to be dimensionally sufficient to cover the substrates 20 mounted with the chips 21 thereon. In other words, edge sides 232A of the heat spreader module plate 23A necessarily extend out of edge sides 203 of the substrates 20 (indicated as dotted lines shown in FIG. 1(A)). An adhesive module layer 233A made of polyimide resin is formed on a top surface of the heat spreader module plate 23A. Besides the adhesive module layer 233A, the top surface of the heat spreader module plate 23A can also be coated with a resin material composed of thermosetting resin such as Marken 7224 and UV-setting epoxy resin such as Markem 9060. It should be noted that adhesion force between the coated layer and an molding compound used for encapsulating the chips 21 is larger than that between the coated layer and the top surface of the heat spreader module plate 23A, as well as the adhesion force between the coated layer and the heat spreader module plate 23A is smaller than that between the heat spreader module plate 23A and the molding compound.

Figure 1E:
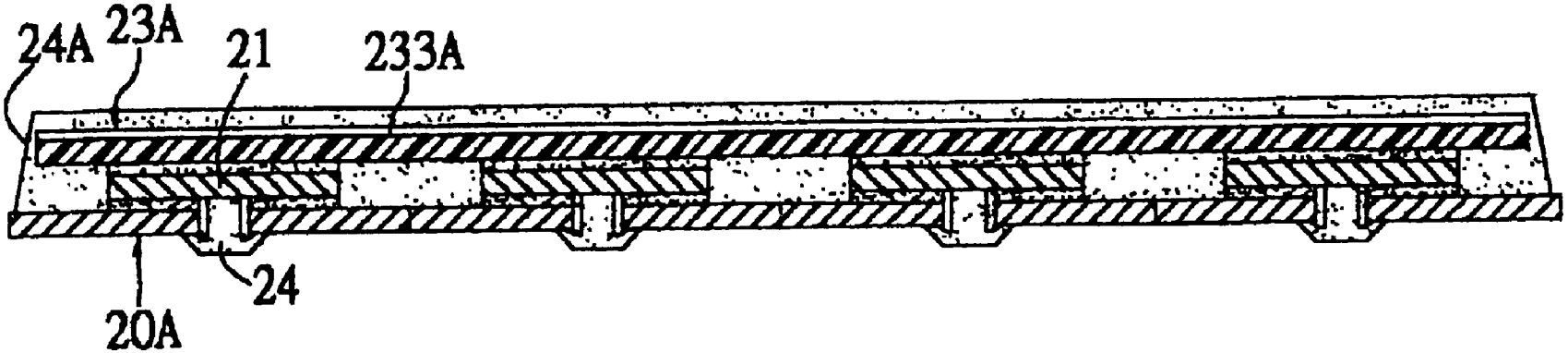

Referring to FIG. 1(E), combined structure of the heat spreader module plate 23A, the chips 21 and the substrate module plate 20A is placed in a molding cavity of a mold (not shown) for performing a molding process, wherein the adhesive module layer 233A on the heat spreader module plate 23A does not abut a top wall of the molding cavity, and is properly spaced from the top wall by a gap. By injecting the molding compound into the molding cavity, an encapsulant body 24A is formed for encapsulating the heat spreader module plate 23A, the chips 21, the gold wires 22 and the substrate module plate 20A. Due to the gap formed between the adhesive module layer 233A and the top wall of the molding cavity, during the mold engagement in the molding process, the chips 21 do not suffer pressure from the mold or the heat spreader module plate 23A, and thus can be prevented from cracking. Further, since it is not necessary to accurately control the height for attaching the heat spreader module plate 23A to the chips 21, so that quality and reliability of fabricated products can be effectively assured.

Figure 1F:
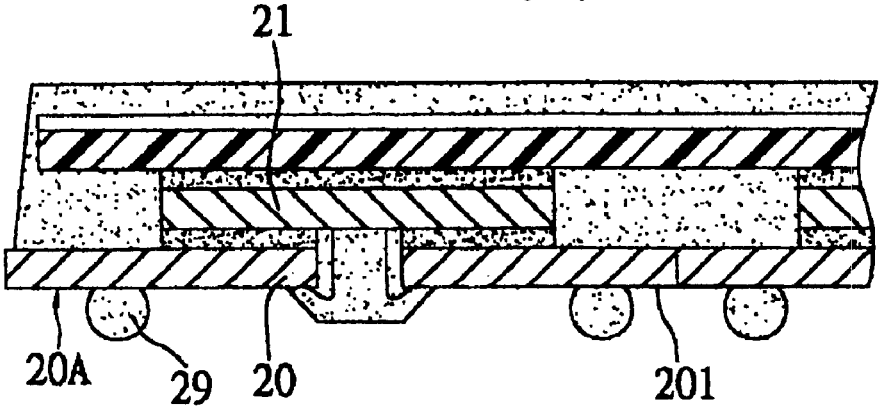

Referring to FIG. 1(F), after the molding process is completed, a plurality of solder balls 29 are implanted on the lower surface 201 of each of the substrates 20 of the substrate module plate 20A, for providing electrical connection between the chips 21 and external devices. Since such a ball implantation process employs conventional technology, it is not further described herein.

Figure 1G:
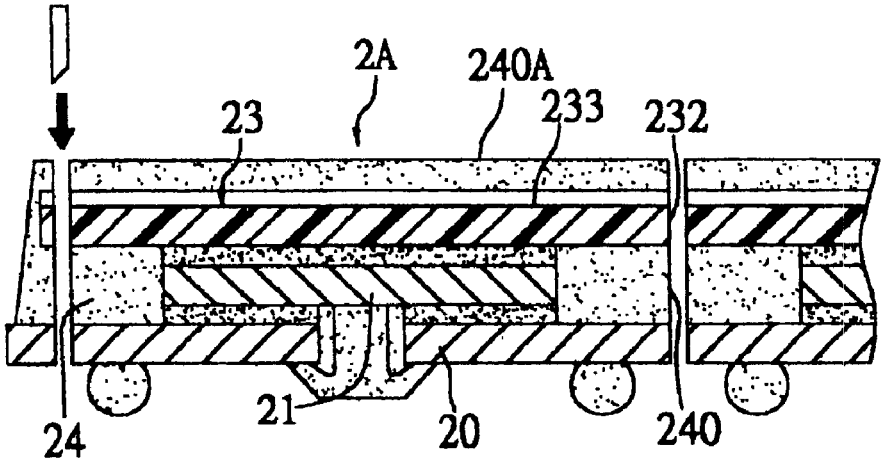

Referring to FIG. 1(G), a singulation process is implemented to form individual sixteen singulated semiconductor packages 2A. In the singulation process, a jig (not shown) is utilized to absorb vacuum the semi-fabricated packages implanted with the solder balls, and the singulated packages 2A can be held in position on the jig with residues 240A of the molding compound firmly staying on the heat spreader module plate 23A, due to the adhesive module layer 233A for effectively adhering the residues 240A to the heat spreader module plate 23A. This makes the singulated packages 2A remain intact in structure after the singulation process is accomplished; that is, the singulated packages 2A each includes the substrate 20 formed by singulating the substrate module plate 20A, the chip 21 mounted on the substrate 20, an adhesive layer 233 formed by singulating the adhesive module layer 233A, a heat spreader 23 formed by singulating the heat spreader module plate 23A, and an encapsulant 24 formed by singulating the encapsulant body 24A. Therefore, the singulation process is successfully implemented, and the singulated packages 2A are free of damage, unlike the prior art with damage to singulated packages due to detachment of molding compound residues.

In the singulated package 2, edge sides 232 of the heat spreader 23 are exposed to outside of the encapsulant 24 and aligned with edge sides 240 of the encapsulant 24; this eliminates the occurrence of flashes of the molding compound on the edge sides 232 of the heat spreader 23, and also makes the heat spreader 23 desirably same in surface area as the substrate 20, without the need of dimensionally matching the heat spreader 23 and the molding cavity of the mold. Moreover, the heat spreaders 23 are attached to the chips 21 in a batch-type manner; this therefore simplifies fabrication processes, as well as reduces time consumption and costs in fabrication.

Figure 1H:
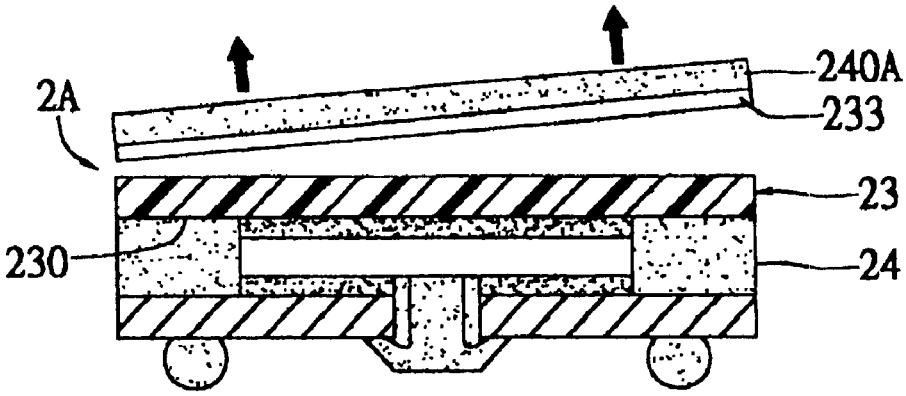

Referring finally to FIG. 1(H), a removing process is implemented to remove the molding compound residues 240A and the adhesive layers 233 for the singulated packages 2A. Since adhesion force between the heat spreader 23 and the adhesive layer 233 is smaller than that between the adhesive layer 233 and the residues 240A formed on the adhesive layer 233, thus removal of the residues 240A is accompanied with the adhesive layer 233 detached from the heat spreader 23. Further, since the adhesion force between the heat spreader 23 and the encapsulant 24 is larger than that between the adhesive layer 233 and the heat spreader 23, thus the residues 240A and the adhesive layer 233 can be completely removed from the heat spreader 23, without affecting the bonding between the heat spreader 23 and the encapsulant 24. As a result, the heat spreader 23 is able to entirely expose to outside of the encapsulant 24 and in direct contact with the atmosphere, and no subsequent deflash process is required. This therefore reduces costs in fabrication, and assures quality and appearance of the fabricated semiconductor package 2, as shown in FIG. 2.

Second Preferred Embodiment

Figure 3:
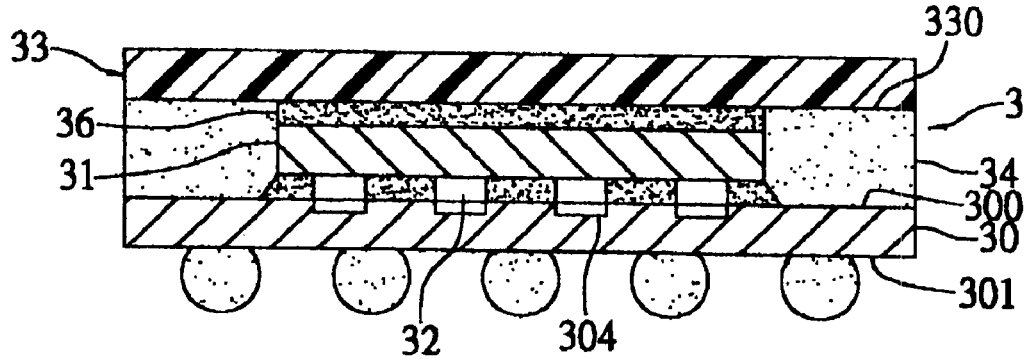
FIG. 3 is a sectional view of a semiconductor package fabricated in the use of a method of a second preferred embodiment of the invention.

FIG. 3 illustrates a semiconductor package 3 fabricated in the use of a method of a second preferred embodiment of the invention. The semiconductor package 3 is similarly fabricated as the semiconductor package 2 in the first embodiment, with the only difference in that, the semiconductor package 3 utilizes a flip-chip substrate 30. On an upper surface 300 of the substrate 30 there are disposed a plurality of bump pads 304 at predetermined positions, and a plurality of conductive traces (not shown) are formed respectively on the upper surface 300 and an opposing lower surface 301 of the substrate 30. Then, a plurality of solder bumps 32 are bonded to the corresponding bump pads 304, so as to electrically connect a chip 31 to the substrate 30 in a flip-chip manner via the solder bumps 32. The chip 31 is subsequently attached to a first surface 330 of a heat spreader 33 via an adhesive 36, allowing heat generated by the chip 31 to be directly transmitted to the heat spreader 33.

Third Preferred Embodiment

Figure 4:
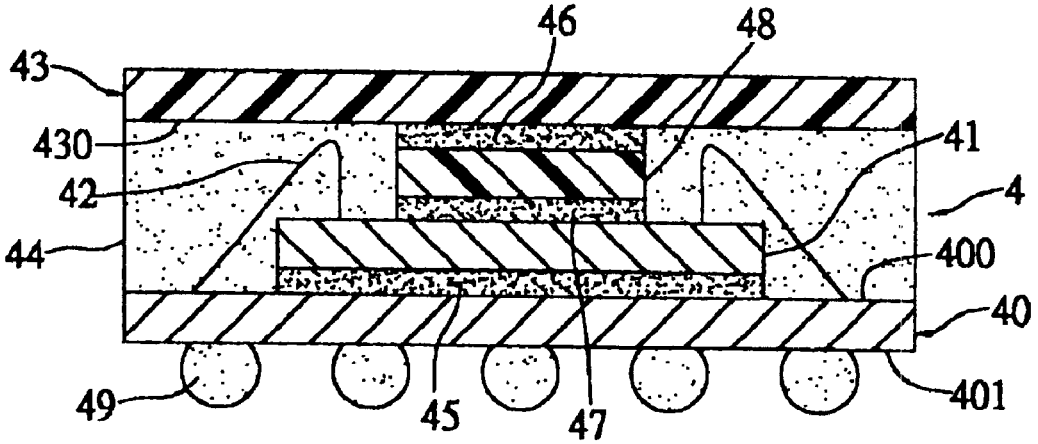
FIG. 4 is a sectional view of a semiconductor package fabricated in the use of a method of a third preferred embodiment of the invention.

FIG. 4 illustrates a semiconductor package 4 fabricated in the used of a method of a third preferred embodiment of the invention. The semiconductor package 4 is similarly fabricated as the semiconductor package 2 in the first embodiment, with the only difference in that, the semiconductor package 4 utilizes a conventional BGA (ball grid array) substrate 40. A plurality of conductive traces (not shown) are formed on an upper surface 400 and a lower surface 401 of the substrate 40 respectively, and electrically connected to each other. Since this employs conventional technology, it is not further described herein. After attaching a chip 41 to the upper surface 400 of the substrate 40 via an adhesive 45 such as silver paste, the chip 41 is electrically connected to the substrate 40 via a plurality of gold wires 42. Then, a buffer pad 48 is adhered to the chip 41 at an approximately central position on a surface with the gold wires 42 bonded thereon. The buffer pad 48 is dimensionally restricted as not to interfere with the arrangement of the gold wires 42, and needs to have a thickness slightly larger than loop height of the gold wires 42, so as to allow a heat spreader 43 to be attached to the buffer pad 48 via an adhesive 46 in a manner that a first surface 430 of the heat spreader 43 does not come into contact with the gold wires 42. Moreover, the buffer pad 48 can release thermal stress generated from the heat spreader 43 against the chip 41 due to the difference in coefficient of thermal expansion under a high temperature environment, and therefore protect the chip 41 against cracking due to the thermal stress. Nevertheless, heat generated by the chip 41 still can be transmitted through the buffer pad 48 to the heat spreader 43 to be dissipated to the atmosphere since the heat spreader 43 is exposed to outside of an encapsulant 44 that encapsulates the chip 41 and the buffer pad 48. Besides, a plurality of solder balls 49 are implanted on the lower surface 401 of the substrate 40 by using a conventional ball implantation technology, for providing electrical connection of the chip 41 to external devices.

Fourth Preferred Embodiment

Figure 5:
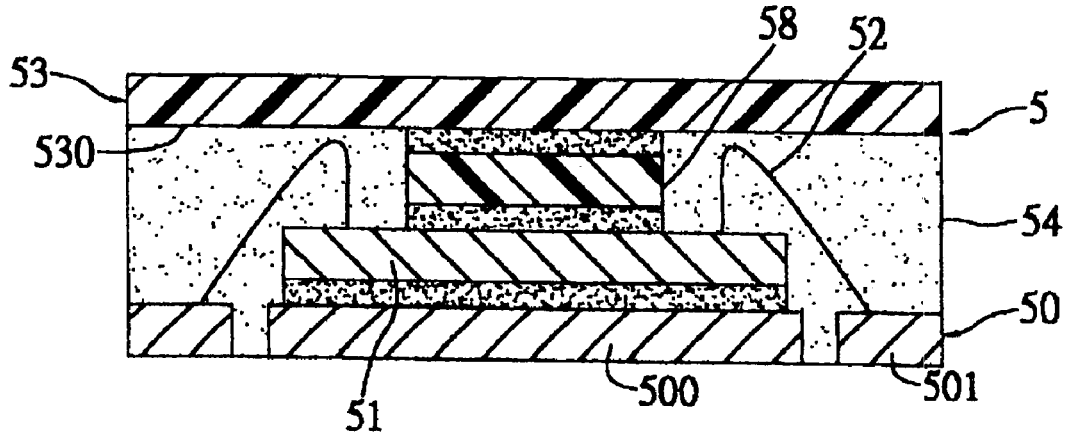
FIG. 5 is a sectional view of a semiconductor package fabricated in the use of a method of a fourth preferred embodiment of the invention.

FIG. 5 illustrates a semiconductor package 5 fabricated in the use of a method of a fourth preferred embodiment of the invention. The semiconductor package 5 is similarly fabricated as the semiconductor package 4 in the third embodiment, with the only difference in that, the semiconductor package 5 utilizes a QFN (quad flat non-lead) lead frame 50 as a chip carrier for accommodating a chip 51. The QFN lead frame 50 has a die pad 500 and a plurality of leads 501. The chip 51 is attached to the die pad 500, and electrically connected to the leads 501 through the use of gold wires 52. A buffer pad 58 is disposed on the chip 51, for mounting a heat spreader 53 thereon, thereby making the buffer pad 58 interposed between the chip 51 and the heat spreader 53, such that a first surface 530 of the heat spreader 53 does not come into contact with the gold wires 52. Further, an encapsulant 54 is formed between the first surface 530 of the heat spreader 53 and the QFN lead frame 50, for encapsulating the chip 51 and the buffer pad 58 in a manner that, the chip pad 500 and a bottom surface of the leads 501 are exposed to outside of the encapsulant 54.

Fifth Preferred Embodiment

Figure 6:
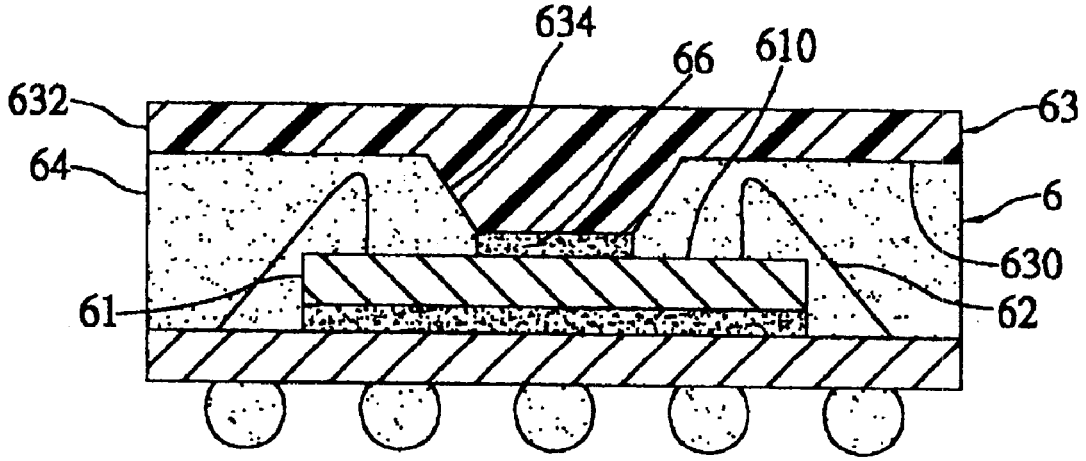
FIG. 6 is a sectional view of a semiconductor package fabricated in the use of a method of a fifth preferred embodiment of the invention.

FIG. 6 illustrates a semiconductor package 6 fabricated in the use of a method of a fifth preferred embodiment of the invention. The semiconductor package 6 is similarly fabricated as the semiconductor package 4 in the third embodiment, with the only difference in a heat spreader 63 used in the semiconductor package 6. The heat spreader 63 is formed on its first surface 630 with a connecting portion 634 extending towards a chip 61, in a manner that the connecting portion 634 is directly attached to an active surface 610 of the chip 61 via an adhesive 66. This allows heat generated by the chip 61 to be directly transmitted to the heat spreader 63 for dissipation to the atmosphere since the heat spreader 63 is exposed to outside of an encapsulant 64 that encapsulates the chip 61, thereby making heat dissipating efficiency further improved. Moreover, the provision of the connecting portion 634 makes the first surface 630 of the heat spreader 63 properly spaced apart from loop tops of gold wires 62, without coming into contact with the gold wires 62.

Sixth Preferred Embodiment

Figure 7:
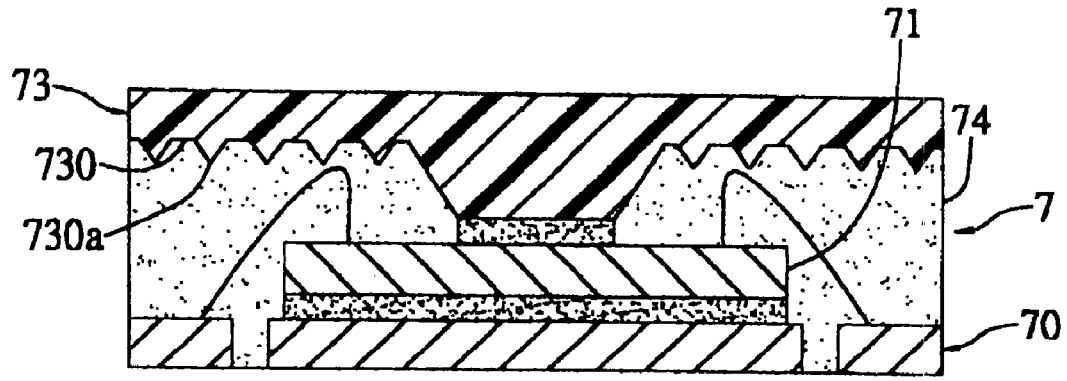
FIG. 7 is a sectional view of a semiconductor package fabricated in the use of a method of a sixth preferred embodiment of the invention.
Figure 8:
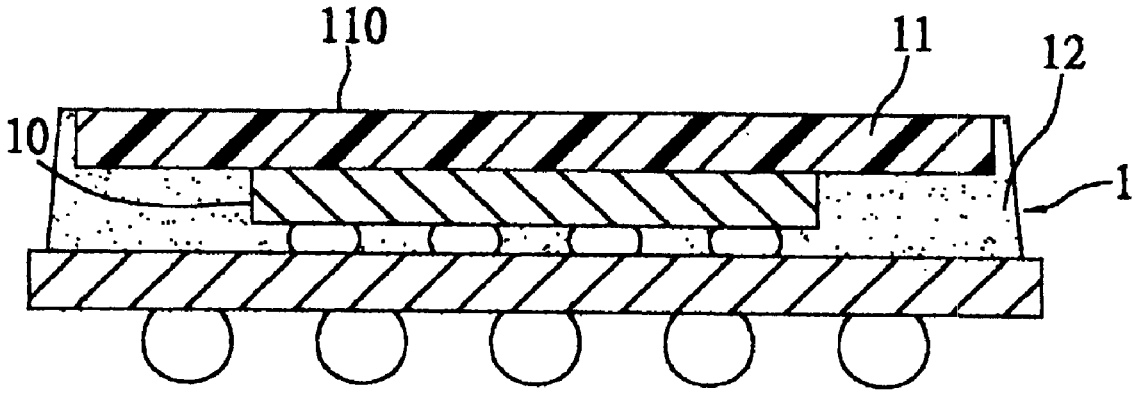
FIG. 8 (PRIOR ART)
FIG. 8 (PRIOR ART) is a sectional view of a conventional semiconductor package with a heat spreader.

FIG. 7 illustrates a semiconductor package 7 in the use of a method of a sixth preferred embodiment of the invention. The semiconductor package 7 is similarly fabricated as the semiconductor package 5 in the fourth embodiment, with the only difference in a plurality of protruding portions 730a formed on a first surface 730 of a heat spreader 73 used in the semiconductor package 7. The provision of the protruding portions 730a enhances bonding area between the first surface 730 of the heat spreader 73 and an encapsulant 74 used for encapsulating a chip 71 mounted on a QFN lead frame 70, so that adhesion force between the heat spreader 73 and the encapsulant 74 is improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of making a semiconductor package with a heat spreader, comprising the steps of:

preparing a matrix-type chip carrier module plate consisting of a plurality of array-arranged chip carriers, wherein each of the chip carriers has an upper surface and a lower surface;

mounting at least one chip at a predetermined position on the upper surface of each of the chip carriers, and electrically connecting the chip to the chip carrier;

providing a heat spreader module plate having an upper surface, and a lower surface attached to the chips mounted on the chip carriers so as to interpose the chips between the chip carrier module plate and the heat spreader module plate, and forming an interface layer on the upper surface of the heat spreader module plate, wherein adhesion force between the interface layer and a molding compound used for forming an encapsulant is larger than that between the interface layer and the heat spreader module plate, as well as adhesion force between the interface layer and the heat spreader module plate is smaller than that between the heat spreader module plate and the molding compound;

forming the encapsulant by using the molding compound for encapsulating the heat spreader module plate and the chips;

performing a singulation process to form individual semi-fabricated semiconductor packages; and removing residues of the molding compound formed on the interface layer of each of the semi-fabricated semiconductor packages so as to form the semiconductor package.

2. The method of claim 1, wherein the heat spreader module plate is dimensionally sufficient to completely cover the chip carriers of the chip carrier module plate.

3. The method of claim 1, wherein the interface layer is an adhesive tape.

4. The method of claim 1, wherein the interface layer is made of a resin compound.

5. The method of claim 1, wherein the adhesion force between the interface layer and the heat spreader module plate needs to be sufficient to keep the heat spreader module plate firmly stay with the interface layer in the singulation process.

6. The method of claim 1, wherein the chip carrier is a substrate, and the chip is electrically connected to the substrate by bonding wires or solder bumps.

7. The method of claim 1, wherein the chip carrier is a QFN (quad flat nonlead) lead frame, and the chip is electrically connected to the QFN lead frame by bonding wires.

8. The method of claim 1, wherein the lower surface of the heat spreader module plate is roughened, corrugated or made uneven.

9. The method of claim 1, wherein the lower surface of the heat spreader module plate is formed at positions corresponding to the chips with a plurality of connecting portions extending towards the chips, in a manner that the connecting portions are connected to the chips, allowing the lower surface of the heat spreader module plate other than the connecting portions to be spaced apart from the chip.

10. The method of claim 1, after forming the encapsulant, further comprising a step of: implanting a plurality of solder balls on the lower surface of each of the chip carriers, for providing electrical connection of the chips to external devices.

11. A method of making a semiconductor package with a heat spreader, comprising the steps of:

preparing a matrix-type chip carrier module plate consisting of a plurality of array-arranged chip carriers, wherein each of the chip carriers has an upper surface and a lower surface;

mounting at least one chip at a predetermined position on the upper surface of each of the chip carriers, allowing the chip to be electrically connected to the chip carrier;

depositing at least one buffer pad on each of the chips, wherein the buffer pad is made of a material similar in coefficient of thermal expansion to the chip;

providing a heat spreader module plate having an upper surface, and a lower surface attached to the chips mounted on the chip carriers so as to interpose the chips between the chip carrier module plate and the heat spreader module plate, and forming an interface layer on the upper surface of the heat spreader module plate, wherein adhesion force between the interface layer and a molding compound used for forming an encapsulant is larger than that between the interface layer and the heat spreader module plate, as well as adhesion force between the interface layer and the heat spreader module plate is smaller than that between the heat spreader module plate and the molding compound;

forming the encapsulant by using the molding compound for encapsulating the heat spreader module plate and the chips;

performing a singulation process to form individual semi-fabricated semiconductor packages; and removing residues of the molding compound formed on the interface layer of each of the semi-fabricated semiconductor packages so as to form the semiconductor package.

12. The method of claim 11, wherein the heat spreader module plate is dimensionally sufficient to completely cover the chip carriers of the chip carrier module plate.

13. The method of claim 11, wherein the interface layer is an adhesive tape.

14. The method of claim 11, wherein the interface is made of a resin compound.

15. The method of claim 11, wherein the adhesion between the interface layer and the heat spreader module plate needs to be sufficient to keep the heat spreader module plate firmly stay with the interface layer in the singulation process.

16. The method of claim 11, wherein the chip carrier is a substrate, and the chip is electrically connected to the substrate by bonding wires.

17. The method of claim 11, wherein the chip carrier is a QFN (quad flat nonlead) lead frame, and the chip is electrically connected to the QFN leadframe by bonding wires.

18. The method of claim 11, wherein the lower surface of the heat spreader molding board is roughened, corrugated or made uneven.

19. The method of claim 11, after forming the encapsulant, further comprising a step of: implanting a plurality of solder balls on the lower surface of each of the chip carriers, for providing electrical connection of the chips to external devices.

*20. A fabricating method for a semiconductor package, comprising the steps of:*

*preparing a chip carrier having an upper surface and a lower surface;*

*mounting at least one chip on the upper surface of the chip carrier, and electrically connecting the chip to the chip carrier;*

*providing a heat spreader having an upper surface, and a lower surface attached to the chip mounted on the chip carrier so as to interpose the chip between the chip carrier and the heat spreader, and forming an interface layer on the upper surface of the heat spreader, wherein adhesion force between the interface layer and a molding compound used for forming an encapsulant is larger than that between the interface layer and the heat spreader, as well as adhesion force between the interface layer and the heat spreader is smaller than that between the heat spreader and the molding compound;*

*forming the encapsulant by using the molding compound for encapsulating the heat spreader and the chip; and*

*removing residues of the molding compound formed on the interface layer so as to form the semiconductor package.*

*21. The method of claim 20, wherein the heat spreader is dimensionally sufficient to completely cover the chip carrier.*

*22. The method of claim 20, wherein the interface layer is an adhesive tape.*

*23. The method of claim 20, wherein the interface layer is made of a resin compound.*

*24. The method of claim 20, wherein the adhesion force between the interface layer and the heat spreader needs to be sufficient to keep the heat spreader firmly with the interface layer during encapsulation.*

*25. The method of claim 20, wherein the chip carrier is a substrate, and the chip is electrically connected to the substrate by bonding wires or solder bumps.*

*26. The method of claim 20, wherein the chip carrier is a QFN (quad flat nonlead) lead frame, and the chip is electrically connected to the QFN lead frame by bonding wires.*

*27. The method of claim 20, wherein the lower surface of the heat spreader is roughened, corrugated or made uneven.*

*28. The method of claim 20, wherein the lower surface of the heat spreader is formed at positions corresponding to the chips with a plurality of connecting portions extending towards the chip, in a manner that the connecting portions are connected to the chip, allowing the lower surface of the heat spreader other than the connecting portions to be spaced apart from the chip.*

*29. The method of claim 20, after forming the encapsulant, further comprising a step of: implanting a plurality of solder balls on the lower surface of the chip carrier, for providing electrical connection of the chip to an external device.*

* * * * *